United States Patent

Russell et al.

[11] Patent Number: 4,551,643
[45] Date of Patent: Nov. 5, 1985

[54] POWER SWITCHING CIRCUITRY

[75] Inventors: John P. Russell, Pennington; Alvin M. Goodman, Princeton, both of N.J.

[73] Assignee: RCA Corporation, Princeton, N.J.

[21] Appl. No.: 545,047

[22] Filed: Oct. 24, 1983

[51] Int. Cl.[4] .................. H03K 17/284; H03K 17/30; H03K 17/72
[52] U.S. Cl. .................................. 307/570; 307/246; 307/597; 307/304; 307/575
[58] Field of Search ............. 307/246, 252 A, 252 C, 307/252 D, 252 J, 252 W, 570, 597, 594, 599, 304, 575

[56] References Cited

U.S. PATENT DOCUMENTS

| | | | |
|---|---|---|---|
| 2,942,123 | 6/1960 | Schuh, Jr. | 307/597 |
| 3,045,150 | 7/1962 | Mann | 307/599 X |
| 3,206,696 | 9/1965 | Wright | 307/252 C |
| 3,271,700 | 9/1966 | Gutzwiller | 332/14 |
| 3,457,433 | 7/1969 | Watson | 307/252 W X |
| 4,041,332 | 8/1977 | Ohhinata et al. | 307/252 D X |
| 4,184,086 | 1/1980 | Sagawa et al. | 307/252 D X |
| 4,298,809 | 11/1981 | Onda et al. | 307/252 C |
| 4,364,073 | 12/1982 | Becke et al. | 357/23 |
| 4,464,585 | 8/1984 | Seki | 307/252 C |

OTHER PUBLICATIONS

J. P. Russell et al., "The COMFET-A New High Conductance MOS-Gated Device", *IEEE E.D. Letters*, vol. EDL-4, No. 3, Mar. 1983, pp. 63-65.
GE Preliminary Data Sheet D94FQ4, R4, "Power-MOS 1GT Insulated Gate Transistor", Jun. 1983.
B. J. Baliga et al., "Modulated-Conductivity Devices Reduce Switching Losses", EDN 9/29/83, pp. 153-162.

*Primary Examiner*—Larry N. Anagnos
*Attorney, Agent, or Firm*—Joseph S. Tripoli; George E. Haas; Henry I. Schanzer

[57] ABSTRACT

A four layer insulated gate controlled semiconductor device has a range of anode-cathode currents over which gate control potentials will extinguish such anode-cathode current. Coupling circuitry for limiting the rate of change of turn-off gate control potential to the gate of the device enhances the range of anode-cathode current over which control is maintained.

4 Claims, 3 Drawing Figures

POWER SWITCHING CIRCUITRY

BACKGROUND OF THE INVENTION

This invention relates to power semiconductors and in particular to circuitry for extending the range of anode currents of a four-layer insulated-gate-controlled device over which control can be maintained by gate-cathode potentials.

Four-layer insulated-gate-controlled devices or conductivity-modulated-FET's are devices which are fabricated similarly to MOS-gated thyristors but which include a shunting resistance between the base and emitter of the npn transistor. This shunting resistor has the effect of reducing the gain of the npn transistor and prevents the conductivity-modulated-FET from going into a latched stated over a wide range of anode current. Within this wide range, by the potential applied to the gate of the FET can control the current flowing between the anode-and-cathode and the anode current may be extinguished by applying appropriate turn-off gate potential. For anode currents exceeding this range, the device goes into a latched state which can only be overcome by direct reduction of the anode current. That is, the anode-to-cathode current is no longer a function of, or controlled by, the gate potential, and a turn-off potential applied to the gate can not extinguish or interrupt the anode-to-cathode current.

A problem exists in that devices operated within a supposedly controllable (i.e. linear and non-latched) region assume, or go into, a latched condition (i.e. a condition where the gate-to-cathode potential has no control over the anode-to-cathode current level and cannot cut-off conduction) when a relatively sharp turn-off signal is applied to their gate terminals.

SUMMARY OF THE INVENTION

The present inventors discovered that the range of anode currents over which gate control can be maintained may be extended by controlling the transition time of gate "turn-off" potentials. To this end, circuitry is coupled to the gate electrode of the device which tends to slow the turn-off transition and thereby extend the gate controlled anode current by a factor of 2:1 or greater.

DETAILED DESCRIPTION

Figure 1:
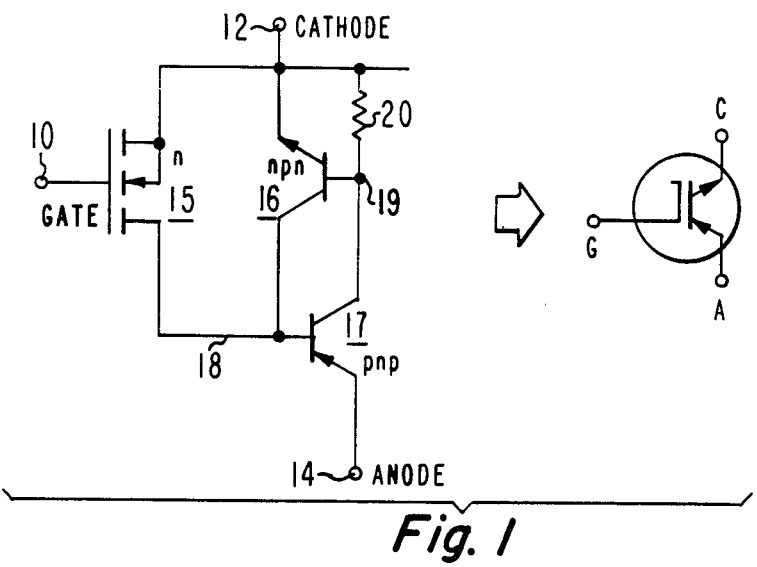
FIG. 1 is a schematic diagram of a typical four layer conductivity-controlled-FET known in the art.

FIG. 1 is a schematic diagram of a four layer insulated gate controlled semiconductor of the type described in U.S. Pat. No. 4,364,073 (incorporated herein by reference). The device is a three terminal device having gate (10), anode (14) and cathode (12) electrodes. Electrically the device may be described as an npn bipolar transistor (16) having its emitter electrode connected to the cathode terminal (12) and a pnp transistor (17) having its emitter electode connected to the anode terminal (14). The base and collector electrodes of npn transistor (16) are respectively connected to the collector and base electrodes of pnp transistor (17). The n-channel FET (15) has its control electrode connected to the gate terminal (10) and source and drain electrodes respectively connected to cathode terminal (12) and to the base electrode (18) of the pnp bipolar transistor (17). A shunting resistance (20) is connected between the base of npn transistor (16) and the cathode terminal (12). In the normal mode of operation, a positive potential is applied to the anode relative to the cathode. When the gate is at zero potential with respect to the cathode, no anode current flows (as long as the anode-cathode potential is below the forward breakdown level). Applying a gate-cathode potential greater than the threshold potential of n-channel FET (15) produces a base current in pnp transistor 17 through FET (15). This base current initiates collector current in transistor (17) which is applied to the base of npn transistor 16 which in turn initiates collector current in npn transistor 16. In the absence of shunting resistor 20 transistors (16) and (17) would tend to latch in a high conductance state similar to that of a thyristor. The resistor (20), however, shunts a portion of the collector current from pnp transistor (17) from the base electrode of npn transistor (16). This maintains the collector feedback of npn transistor (16) to the base electrode of pnp transistor (17) to a gain of less than one, preventing latch up at least for a range of anode currents. In this range of anode currents gate control is maintained over the device and the device can be turned off in response to a zero gate-cathode potential. For larger anode currents, insufficient current is shunted by resistance 20 to prevent the bipolar transistors from latching and gate control is lost.

Within the range of anode currents where gate control obtains, anode-cathode current is substantially maintained by the FET (15) providing base current to the pnp transistor in parallel with base current provided by the collector of npn transistor (16). When the FET is biased off, the collector current of pnp transistor (17), is reduced by the current gain of pnp (17) times the current previously provided by FET (15). Since the base current fed back by the collector of the npn transistor (16) has an effective gain of less than one, there is insufficient drive to maintain the pnp transistor 17 in conduction and the anode current is extinguished.

The present inventors discovered, however, that the range of gate controlled anode currents is a function of gate turn-off time. One possible explanation for this phenomena is set forth as follows. Consider the device to be conducting large anode current but that the device is not operating in the latched mode. The FET (15) is operating in the triode region tending to establish the collector-emitter potential of the npn transistor (16) at a low value. The emitter electrode of the pnp transistor (17) is clamped at a potential $V_{BE}$ above the value of its base potential. If the FET (15) is turned off rapidly, the potential at the emitter of the pnp transistor becomes unclamped and will rise rapidly producing a rapid positive going potential change at its base electrode. The potential change at the base electrode of pnp transistor (17) is coupled via the pn depletion-capacitances of the structure to the base electrode of npn transistor (16). The potential coupled to the base of the npn transistor 16 induces additional collector current therein, momentarily increasing the regenerative feedback to the base npn transistor (16) and causing the two bipolar transistors to latch. On the other hand, if for the same original anode current the FET (15) is turned off slowly, significant potential coupling between the base electrodes of the bipolar devices cannot occur and the device will not latch.

By applying slow turn-off potential transitions at the gate of the device, the gate controlled range of anode currents can be increased significantly over the gate controlled range of anode currents associated with fast gate potential turn-off transitions. The inventors therefore coupled circuitry to the gate terminal to increase the duration of gate potential turn-off transitions.

Figure 2:
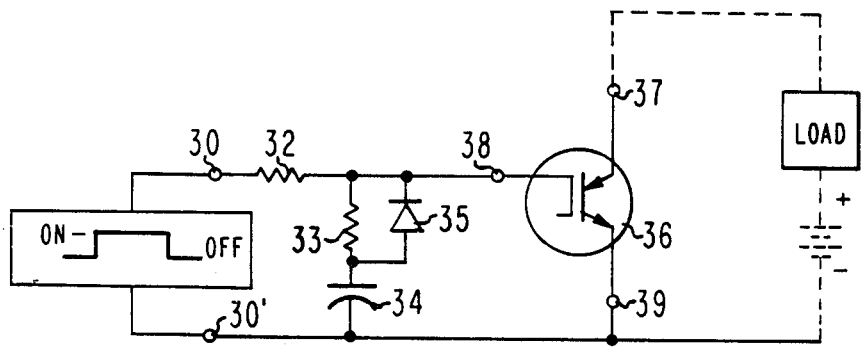
FIGS. 2 and 3 are schematic diagrams of exemplary circuitry coupled with conductivity-modulated-FET's for extending the controlled anode current range of the device.

FIG. 2 illustrates a conductivity-modulated-FET (36) in combination with gate circuitry for retarding gate turn-off potential transitions without substantially affecting gate turn-on potential transitions. In the figure, gate control potentials are applied between terminals 30 and 30'. Positive potentials (greater than the threshold potential of the FET) applied to terminal 30 relative to terminal 30' turn device (36) on, and zero potentials tending to turn the device off. Terminal 30 is connected to the gate terminal (38) of device (36) by a resistor (32) and terminal 30' is directly connected to the cathode terminal (39). A resistor (33) and a capacitor (34) are serially connected between the gate (38) and cathode (39) terminals. A diode (35) is connected across resistor (33) and is poled to conduct current toward the gate terminal. Finally, a utilization means or load and a potential or current source are serially connected between the cathode (39) and anode (37) terminals of device (36).

Resistor (33) nominally has a much larger resistance value than resistor (32) and a much larger resistance value than the forward or "on" resistance of diode (35). A positive potential applied to terminal 30 reverse biases diode (35) and due to the ratio of resistors (32) and (33) is substantially unattenuated by resistor (32). The positive going turn-on transition at terminal 30 is translated to gate terminal (38) substantially unaffected by the circuit elements (32), (33), (34) and (35).

Capacitor 34 charges to the "on" potential applied between terminals 30-30' through the resistors (32) and (33). If the input control signal is then taken to zero volts, i.e., to turn off the device, diode (35) becomes forward biased due to the positive potential on capacitor (34). The forward biased diode effectively shorts the gate terminal (38) to the capacitor (34), and resistor (32) and capacitor (34) form a low pass filter between control input terminals 30-30' and the gate terminal (38). Negative going potential transitions applied between terminals 30-30' are slowed by the RC time constant of the filter. The circuitry coupled between the source of gate control potentials and the gate (38) and cathode (39) terminals of device (36) affords a means for coupling fast turn-on and slowed turn-off potentials to device 36, and provides a means to extend the range of gate controlled anode currents over which device (36) can be operated. Thus, the supply potential in series with the load can be increased in magnitude for the same load relative to a similar device (36) which is controlled with fast gate turn-off potential transitions.

Figure 3:
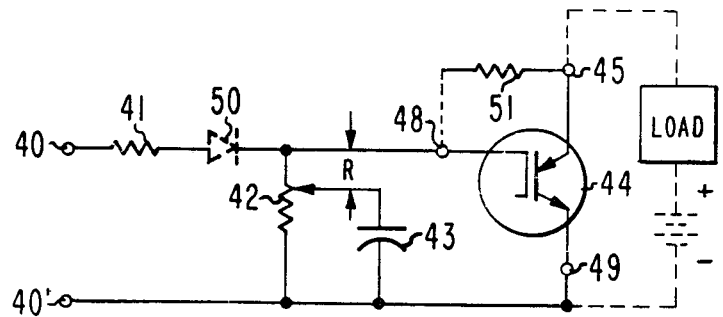

FIG. 3 is an alternative arrangement for slowing or retarding turn-off transitions but which slows the turn-on transition in a complementary manner. In FIG. 3 a resistor (41) is connected in series with the gate terminal (48) of device (44) and a potentiometer (42) shunts the gate (48) and cathode (49) terminals. A capacitor (43) is connected between the wiper of potentiometer (42) and the cathode terminal (49). Assume that the resistance between capacitor (43) and the gate terminal (48) is small relative to the resistance of resistor (41). If capacitor (43) is discharged and a positive potential is applied between terminals 40-40', initially capacitor (43) functions as a short circuit and a portion of the applied potential $(R/(R+R_{41})V_{applied})$ appears on the gate terminal. As capacitor (43) charges through R and $R_{41}$, the gate potential rises to the value $R_{42}/(R_{41}+R_{42})$ times $V_{applied}$ where $R_{42}$ and $R_{41}$ are the resistance values of resistor (41) and the potentiometer (42), respectively. If the resistance $R_{42} >> R_{41}$ the gate potential approaches $V_{applied}$ and the potential on the capacitor approaches the potential on the gate terminal. Assume that the control potential between terminals 40-40' is rapidly reduced to zero after capacitor 43 is fully charged. The potential $V_c$ on capacitor 43 is dropped across the resistance R and resistor (41). The gate potential becomes $R_{41}/(R_{41}+R) \ V_C \approx V_C \approx V_{applied}$ and decays slowly according to the time constant defined by $(R_{41}+R)C$. This time constant is selected to extend the range of gate controlled anode currents according to the device (44) utilized and the expected turn-off transition of the applied control signal.

Consider next the FIG. 3 arrangement with the diode 50 coupled in series with resistor 41 and the wiper of potentiometer 42 at its topmost excursion so that resistance R42 is in parallel connection with capacitor 43. For a turn-on potential applied to terminals 40-40', diode 50 is forward biased and resistor 41 establishes the source driving impedance for charging capacitor 43, i.e. for R41<<R42. And if the resistance R41 is small, capacitor 43 charges rapidly producing a fast turn-on potential transition at gate terminal 48. For a turn-off potential applied to terminals 40-40', diode 50 is reverse biased effectively open circuiting terminals 40-40', and capacitor 43 discharges through resistor 42. For large values of R42, the capacitor 43 discharges slowly producing relatively long turn-off potential transitions at gate terminal 48. With this arrangement, the turn-on and turn-off potential transitions applied at gate terminal 48 can be made significantly different depending on the values selected for resistors 41 and 42 and thereby provides a means to extend the range of gate controlled anode currents in device 44 without effecting the ability to turn the device on rapidly.

Next consider a further embodiment wherein negative feedback is coupled between anode terminal 45 and gate terminal 48 via resistor 51 (diode 50 may be in or out of the circuit). The resistance value, R51, of resistor 51 is large compared with the resistance value of resistor 42 so that R41<<R42<R51. With diode 50 in the circuit and a turn-on potential applied to terminals 40-40', resistor 51 has little effect on the charging of capacitor 43 since R51>>R41. However, when the diode is back biased by an applied turn-off potential, the feedback has a greater effect because of the choice of the relative values of R51 and R42. With diode 50 reverse biased, capacitor 43 initially starts to discharge through resistors 42 and 51. As device 44 begins to turn off, the potential at the anode terminal 45 begins to rise and the direction of current flow in resistor 51 reverses tending to charge capacitor 43. Resistor 42 having a smaller resistance value than resistor 51 dominates the process and effects discharge of capacitor 43. The charging current fed back by resistor 51 does slow the discharge process, however, and lengthens the turn-off potential transition at gate terminal 48 to extend the gate controlled range of anode current.

What is claimed is:
1. In combination:

a four-layered insulated-gate-controlled semiconductor device having gate, cathode and anode terminals, having a conduction path between said cathode and anode terminals and said device being characterized in that the level of its anode-to-cathode current is responsive to and monotonically controlled by, the gate-to-cathode potential for anode-to-cathode currents extending up to a given level; said device being nevertheless susceptible to latch-up for anode-to-cathode current below said given level when the rate of change of a turn-off potential applied to the gate is greater than a given value;

means for applying control potentials between said gate and cathode terminals; and means coupled to said gate terminal for extending the anode-to-cathode current range, in which said device does not latch-up including means for limiting the rate of change of said gate-cathode control potentials having a polarity tending to turn-off said device, and to extinguish anode-to-cathode current conduction.

2. The combination set forth in claim 1 wherein the means coupled to the gate terminal for extending the range of controlled anode currents includes a low pass filter coupled between said gate terminal and said means for applying control potentials.

3. The combination set forth in claim 1 wherein the means coupled to the gate terminal for extending the range of controlled anode current includes:

a first resistance coupled between said means for applying control potentials and said gate terminal;

a second resistance and a capacitance serially coupled between said gate and cathode terminals; and a diode connected in parallel across said second resistance and poled in a direction to conduct between said gate terminal and said capacitor for a control potential transition tending to extinguish anode current.

4. The combination set forth in claim 3 wherein said first resistance is included in the means for applying control potentials.

* * * * *

UNITED STATES PATENT AND TRADEMARK OFFICE
CERTIFICATE OF CORRECTION

PATENT NO. : 4,551,643

DATED : Nov. 5, 1985

INVENTOR(S) : John P. Russell et al.

It is certified that error appears in the above-identified patent and that said Letters Patent is hereby corrected as shown below:

Col. 1, line 17, change "current" to --- currents ---.

Col. 2, line 54, before "$V_{BE}$" insert --- one ---.

Col. 2, line 64, after "base" insert --- of ---.

Signed and Sealed this

Twenty-fifth Day of March 1986

[SEAL]

Attest:

DONALD J. QUIGG

Attesting Officer

Commissioner of Patents and Trademarks